(12) United States Patent
Ward et al.

(10) Patent No.: US 7,722,215 B2
(45) Date of Patent: May 25, 2010

(54) 360 DEGREE VIEWABLE LIGHT EMITTING APPARATUS

(75) Inventors: Matthew Ward, San Francisco, CA (US); Jeremy Hochman, Austin, TX (US); Christopher Varrin, Austin, TX (US)

(73) Assignee: Barco, Inc., Duluth, GA (US)

( * ) Notice: Subject to any disclaimer, the term of this patent is extended or adjusted under 35 U.S.C. 154(b) by 0 days.

(21) Appl. No.: 11/618,387

(22) Filed: Dec. 29, 2006

(65) Prior Publication Data

US 2007/0171639 A1 Jul. 26, 2007

Related U.S. Application Data

(60) Provisional application No. 60/756,577, filed on Jan. 6, 2006.

(51) Int. Cl.
*F21S 4/00* (2006.01)

(52) U.S. Cl. .............................. 362/249.01; 362/249.02

(58) Field of Classification Search ................ 362/238, 362/249, 227, 231, 235, 240, 252, 336, 374, 362/375, 470, 545, 800; 340/321, 468, 473, 340/815.45
See application file for complete search history.

(56) References Cited

U.S. PATENT DOCUMENTS

| | | | | |
|---|---|---|---|---|
| 4,304,966 A * | 12/1981 | Beirn et al. | ................ | 379/165 |
| 4,470,101 A * | 9/1984 | Drexler | ................ | 361/802 |
| 4,783,726 A * | 11/1988 | Wang | ................ | 362/252 |
| 4,841,278 A * | 6/1989 | Tezuka et al. | ................ | 340/908.1 |
| 5,152,601 A * | 10/1992 | Ferng | ................ | 362/183 |
| 5,453,729 A * | 9/1995 | Chu | ................ | 340/332 |
| 5,577,832 A * | 11/1996 | Lodhie | ................ | 362/249 |
| 5,771,617 A * | 6/1998 | Baker | ................ | 40/544 |
| 5,806,965 A * | 9/1998 | Deese | ................ | 362/249 |
| 6,299,337 B1 * | 10/2001 | Bachl et al. | ................ | 362/545 |
| 6,317,330 B1 * | 11/2001 | Portman et al. | ................ | 361/742 |
| 6,483,254 B2 * | 11/2002 | Vo et al. | ................ | 315/241 S |
| 6,525,668 B1 * | 2/2003 | Petrick | ................ | 340/815.45 |
| 6,566,824 B2 * | 5/2003 | Panagotacos et al. | ................ | 315/291 |
| 6,580,228 B1 * | 6/2003 | Chen et al. | ................ | 315/185 R |
| 6,592,238 B2 | 7/2003 | Cleaver et al. | | |
| 6,626,557 B1 * | 9/2003 | Taylor | ................ | 362/249 |
| 6,676,284 B1 | 1/2004 | Wynne Willson et al. | | |
| 6,753,762 B1 * | 6/2004 | Jorba Gonzalez | ................ | 340/333 |
| 6,793,369 B2 * | 9/2004 | Calzaretta et al. | ................ | 362/219 |
| 6,948,830 B1 * | 9/2005 | Petrick | ................ | 362/229 |
| 6,991,351 B1 * | 1/2006 | Petrick | ................ | 362/373 |

(Continued)

FOREIGN PATENT DOCUMENTS

JP 10030215 A * 2/1998

(Continued)

*Primary Examiner*—Hargobind S Sawhney
(74) *Attorney, Agent, or Firm*—Aka Chan LLP (57) ABSTRACT

A light emitting apparatus and method of manufacturing thereof are disclosed. The light emitting apparatus includes a plurality of printed circuit boards connected to one another, a light emitting element disposed on and electrically connected to each printed circuit board, and at least one connector disposed between the printed circuit boards. The method of manufacturing the light emitting apparatus includes disposing a light emitting element on a plurality of printed circuit boards, arranging planar surfaces of the plurality of printed circuit boards substantially opposite, and connecting the plurality of printed circuit boards to one another.

31 Claims, 8 Drawing Sheets

U.S. PATENT DOCUMENTS

| | | | |
|---|---|---|---|
| 7,079,041 B2 * | 7/2006 | Fredericks et al. | 340/815.45 |
| 7,118,248 B2 | 10/2006 | Wynne Willson et al. | |
| 2003/0112627 A1 * | 6/2003 | Deese | 362/249 |
| 2004/0022057 A1 * | 2/2004 | Lee | 362/238 |
| 2005/0122064 A1 * | 6/2005 | Chevalier et al. | 315/291 |

FOREIGN PATENT DOCUMENTS

| | | | | |
|---|---|---|---|---|
| JP | 11025719 | A | * | 1/1999 |
| KR | 2001083642 | A | * | 9/2001 |
| KR | 2004072129 | A | * | 8/2004 |

* cited by examiner

360 DEGREE VIEWABLE LIGHT EMITTING APPARATUS

CROSS REFERENCE TO RELATED APPLICATIONS

This applications claims benefit of U.S. Provisional Applications Ser. No. 60/756,577 filed on Jan. 6, 2006, entitled "Method for creating a 360 degree viewable pixelated LED tube or rope" in the names of Matthew Ward, Jeremy Hochman, Nils Thorjussen, and Chris Varrin.

BACKGROUND OF INVENTION

1. Field of the Invention

Embodiments disclosed herein generally relate to light emitting apparatuses. Specifically, selected embodiments relate to an improved light emitting apparatus for use in various industries.

2. Background Art

Currently, the market for light emitting diode ("LED") technology is growing at an astonishing rate for use in various industries, such as in the entertainment, advertising, and architecture industries. Within this LED technology market are linear LED products, such as LED tubes and LED ropes. These linear LED products have been large contributors to the market's popularity because of their versatility in usage. For example, the linear LED products may be used for neon simulators, decorative lightings, in addition to low resolution video displays.

Because of their high demand, LED ropes and LED tubes are available from several manufacturers. The LED ropes are generally available, though, in a form that is only viewable from one side. The side of the LED ropes that is not viewable contains wires and components that blocks light from the LEDs within the rope from being seen. Similarly, the LED tubes are generally in a form that prevents a 360 degree viewable angle. These LED tubes have an extruded or fabricated metal or plastic component to cover at least a portion of the back of the tubes. This back component of the LED tubes is usually used as a structural support or a base for the LEDs within the tubes. U.S. Pat. Nos. 6,676,284 and 7,118,248, issued to Willson, and U.S. Pat. No. 6,592,238, issued to Cleaver et al., disclose examples of such LED tube systems with a limited viewable angle.

Figure 1:
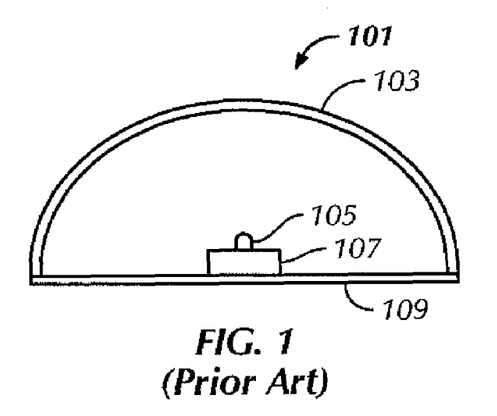
FIG. 1 is a cross-sectional view of a prior art LED tube.

Referring to FIG. 1, an example of a LED tube 101 with a linear array of LEDs 105 is shown. LED tube 101 includes an elongate diffuser 103, made of rigid, translucent diffusing plastics material, mounted onto base 109. LEDs 105 are mounted on and electrically connected to a printed circuit board 107 ("PCB"), in which PCB 107 is mounted on and supported by base 109. Commonly, linear array of LEDs 105 are in close proximity to one another, individually controlled, and have a repeating pattern of colors of red, blue, and green. When in operation and illuminated, light from linear array of LEDs 105 is diffused through diffuser 103 such that, by a distant viewer, the light appears to be emanating from a continuous light source, instead of from individual point light sources of LEDs 105.

Figure 2:
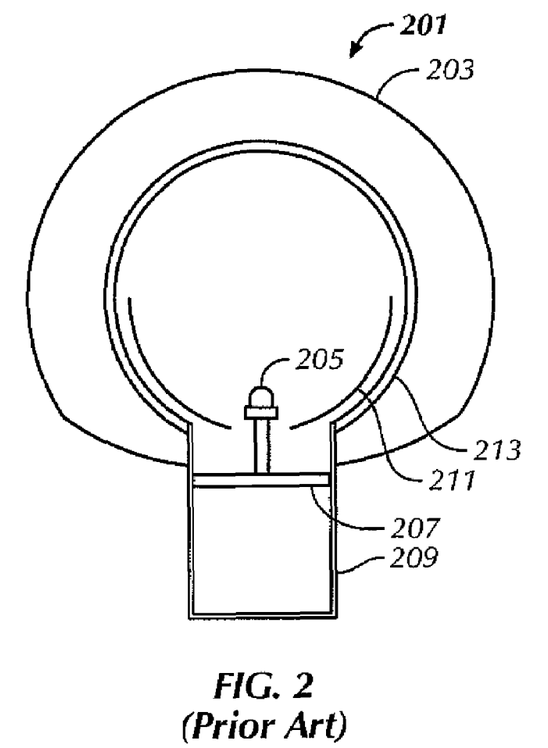
FIG. 2 is a cross-sectional view of another prior art LED tube.

Referring now to FIG. 2, another example of a LED tube 201 is shown. Similar to LED tube 101 in FIG. 1, LED tube 201 comprises a linear array of LEDs 205 mounted on and electrically connected to a PCB 207, in which PCB 207 is mounted on and supported by base 209. Additionally, LED tube 201 has two diffusers (an outer diffuser 203 and an inner diffuser 213) and a reflector 211. Reflector 211 may be used to maximize the light output from LEDs 205, such as reducing the light loss to PCB 207.

As shown with FIGS. 1 and 2, the LED tubes make use of PCB-mounted LEDs with the LEDs arranged in an array or line within the tubes. In these arrangements, the viewable angle of light surrounding the LED tubes is limited by the PCBs and bases on which the LEDs are mounted. In FIG. 1, the viewable angle of LED tube 101 is limited to about 190 degrees. In FIG. 2, the viewable angle of LED tube 201 is limited to about 270 degrees. The use of the diffusers may increase the viewable angles of the LED tubes, but a substantial portion of the LED tubes is blocked by internal and external components of the tubes. With these components blocking light emitting from the LED tubes, the viewable angle of the light from the LED tubes will always be limited.

In response to these common limited viewable angle LED tubes, many manufacturers have created "360 degree" viewable angle linear LED products. These linear LED products, though, still require wires or connectors to pass the data and power signals from one light source to the next. The wires and connectors may then produce a shadow, dark area, or discontinuity on the outside diffuser of the linear LED product. Thus, the viewable angle of linear LED products is still limited from the full 360 degrees.

Accordingly, there exists a need for a linear LED product that minimizes any shadows or discontinuities by the internal connections, wires, or support structures to allow the LED product to be fully viewable from all 360 degrees surrounding the product.

SUMMARY OF INVENTION

In one aspect, embodiments disclosed herein relate to a light emitting apparatus. The light emitting apparatus includes a plurality of printed circuit boards electrically connected to one another, a light emitting element disposed on and electrically connected to each of the plurality of printed circuit boards, and at least one connector disposed between the plurality of printed circuit boards.

In another aspect, embodiments disclosed herein relate to another light emitting apparatus. The light emitting apparatus includes a first printed circuit board having a planar surface, a second printed circuit board having a planar surface, at least one light emitting element disposed on the first and second printed circuit boards, and at least one connector disposed between the first and second printed circuit boards. The planar surface of the second printed circuit board is arranged substantially opposite to the planar surface of the first printed circuit board, and the first printed circuit board is electrically connected to the second printed circuit board.

Further, in another aspect, embodiments disclosed herein relate to a method for manufacturing a light emitting apparatus. The method includes disposing a light emitting element on a plurality of printed circuit boards, arranging the plurality of printed circuit boards such that planar surfaces of the plurality of printed circuit boards are substantially opposite, and electrically connecting the plurality of printed circuit boards to one another.

Other aspects and advantages of the invention will be apparent from the following description and the appended claims.

DETAILED DESCRIPTION

In one aspect, embodiments disclosed herein relate to an improved light emitting apparatus with a 360 degree viewable angle. In another aspect, embodiments disclosed herein relate to a light emitting apparatus having a plurality of PCBs, in which a light emitting element is disposed on each of the plurality of PCBs. In another aspect, embodiments disclosed herein relate to a light emitting apparatus having a plurality of PCBs, in which planar surfaces of the PCBs are substantially opposite of one another.

Figure 3:
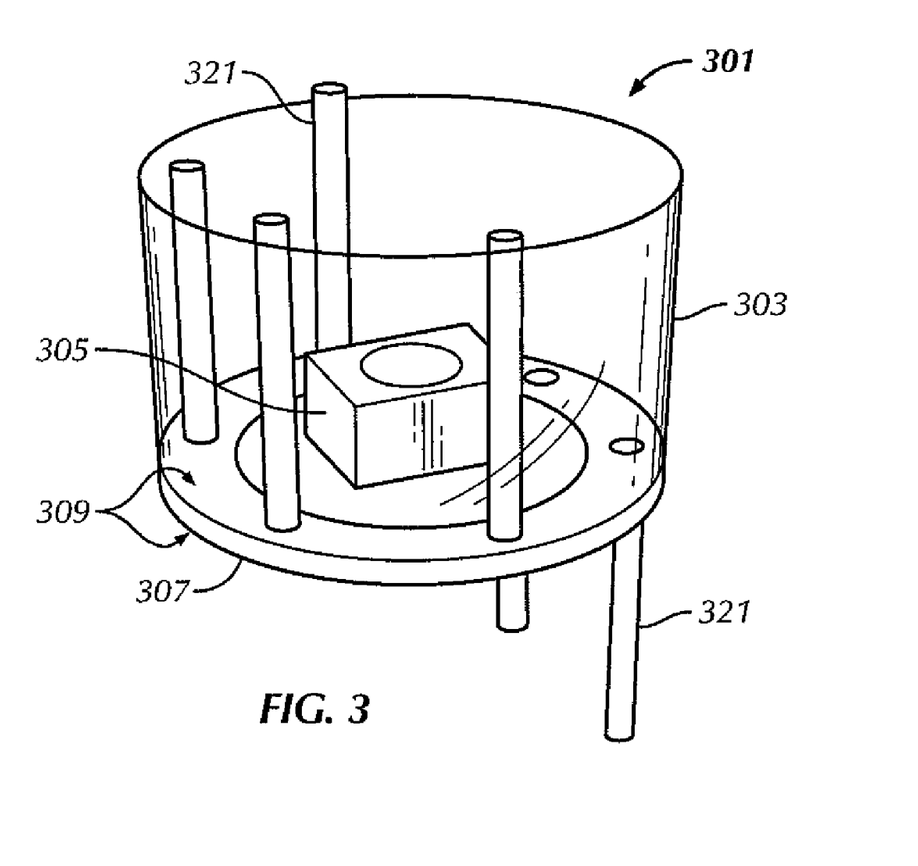
FIG. 3 is a perspective view of a module of a light emitting apparatus in accordance with embodiments disclosed herein.

Referring now to FIG. 3, a perspective view of a module 301 of a light emitting apparatus in accordance with embodiments disclosed herein is shown. Module 301 includes a light emitting element 305 disposed on a PCB 307. As shown, PCB 307 may include planar surfaces 309 (e.g., planar surfaces 309 may include a top surface and a bottom surface of PCB 307). Light emitting element 305 may be disposed on one of, or both, planar surfaces 309. Light emitting element 305 is electrically connected to PCB 307 to enable signals from PCB 307 to control (e.g., turn on and off) light emitting element 305. An optical material 303 may then encompass or enclose PCB 307 and light emitting element 305 of module 301. In this embodiment, optical material 303 is supported against outer edges of PCB 307 to encompass module 301. Further, connectors 321 are disposed on and electrically connected to PCB 307. Connectors 321 may carry all necessary data and power signals for controlling module 301, in which the data and power signals may be supplied to light emitting element 305 through PCB 307. As shown, connectors 321 may be circular in cross-section with a minimum sized diameter to impede as little amount of light as possible emitting from light emitting element 305 and reaching optical material 303.

Preferably, the optical material comprises a diffusive material to diffuse light emitted from light emitting element. However, those having ordinary skill in the art will appreciate that the invention is not so limited, and the optical material may comprise a transparent material, a translucent material, a colored material, a refractive material, a reflective material, a catadioptric material, in addition to any other materials known in the art. Further, those having ordinary skill in the art will appreciate that the invention is not limited to any particular shape. Thus, the optical material may comprise a spherical shape, an aspherical shape, a convex shape, a concave shape, a conical shape, an elliptical shape, a hyperbolic shape, a parabolic shape, a lenticular shape, in addition to any other shapes known in the art. Furthermore, the optical material may comprise any combination of the previously suggested materials and shapes. For example, the optical material may comprise a conical shape with one portion a diffusive material and another portion a colored material, or the optical material may comprise a portion that is both a diffusive and colored material that is of a spherical shape.

Using the connectors to connect between multiple PCBs, multiple modules may be arranged in a stack or 'column alignment' to assemble a light emitting apparatus of the present invention. As used herein, a column alignment refers to an arrangement of the PCBs with respect to one another, in which the PCBs are positioned one above the other with the connectors disposed therebetween. Thus, the light emitting apparatus of the present invention may comprise an arrangement of alternating PCBs and connectors with an optical material encompassing the PCBs.

Those having ordinary skill in the art will appreciate that, although embodiments disclosed herein are only shown with one light emitting element disposed on and electrically connected to each PCB, the invention is not so limited. In other embodiments, multiple light emitting elements, such as multiple LEDs, may be disposed on each PCB. In such a case, the LEDs may emit different colors, such as red, green, and blue, as is common for a pixel comprised of LEDs.

Figure 4A:
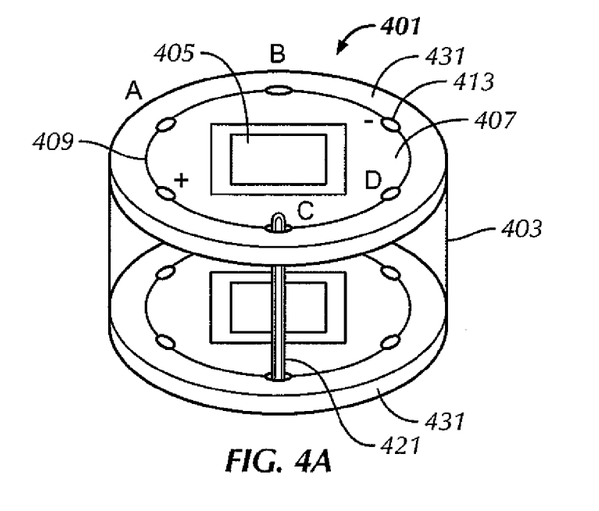
FIGS. 4A-C are perspective views of a module of a light emitting apparatus in accordance with embodiments disclosed herein.
Figure 4B:
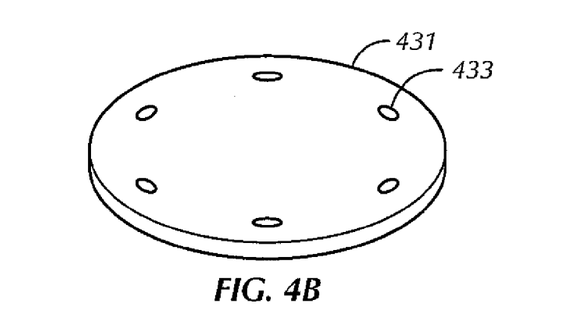
Figure 4C:
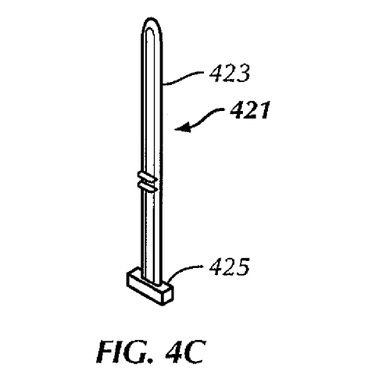

Referring now to FIGS. 4A-C, a perspective view of a module 401 of a light emitting apparatus in accordance with embodiments disclosed herein is shown. Similar to module 301 in FIG. 3, module 401 in FIG. 4A includes a light emitting element 405 disposed on and electrically connected to PCB 407 with an optical material 403 encompassing or enclosing PCB 407 and light emitting element 405. However, in this embodiment, PCB 407 is disposed on a support structure 431 (shown in FIG. 4B), which may be comprised of the same or similar material as optical material 403. Support structure 431 includes guide holes 433 to correspond with guide holes 413 of PCB 407. Specifically, guide holes 433 of support structure 431 are approximately in the same location corresponding to guide holes 413 of PCB 407 so that when PCB 407 is disposed on support structure 431, connectors 421 (shown in FIG. 4C) may pass through holes 413 and 433 without any intrusions.

As shown in FIG. 4C, connector 421 may be a thin, flat blade or fastener and include a pin section 423 and a crimp section 425. Preferably, pin section 423 is sufficient in width to provide a current flow for the transmission of the necessary data and power signals for multiple modules 401, but remains relatively thin to impede a minimum amount of light emitting from light emitting element 405 reaching optical material 403. Crimp section 425 may be used to retain connector 421 within hole 433 of support structure 431 and pin section 423 may be used to electrically connect multiple PCBs 407 to one another. When connected to PCBs 407, preferably connectors 421 are oriented within holes 413, 433 such that pin sections 423 are aligned parallel with the light rays emitting from light emitting elements 405 to impede as little amount of light as possible emitting from light emitting elements 405 reaching optical material 403.

Referring back to FIG. 4A, module 401 may include as many as six holes 413, 433 within PCB 407 and support structure 431, if not more. With six locations (e.g., A, B, C, D, +, −) of holes 413, 433, locations + and − may be used for transmission of power signals, and locations A, B, C, and D may be used for transmission of data signals. For example, when connecting two modules 401, one module may use locations A, B, +, and − of holes 413, 433 for transmission data and power signals, and the other module may use locations C, D, +, and − of holes 413, 433 for transmission of data and power signals. Therefore, some of the data and power signals supplied by connectors 421 through holes 413, 433 may not be utilized in one module, but may be used in another module. However, those having ordinary skill in the art will appreciate the invention is not so limited, and any number of the holes within the PCB may be used.

As shown, the connectors disposed between the multiple PCBs and the optical material that encompasses the PCBs may comprise a rigid material to provide structural support for the light emitting apparatus of the present invention. However, those having ordinary skill in the art will appreciate that the invention is not so limited. For example, in another embodiment, the connectors disposed between the PCBs may comprise a flexible material (e.g., metal bellows) or a spring material (e.g., rubber or metal springs) and the optical material may comprise a flexible material (e.g., thin plastic). In such an embodiment, the light emitting apparatus may then be bent in any direction, similar to that of rope, to increase the flexibility and versatility of the present invention.

Figure 5:
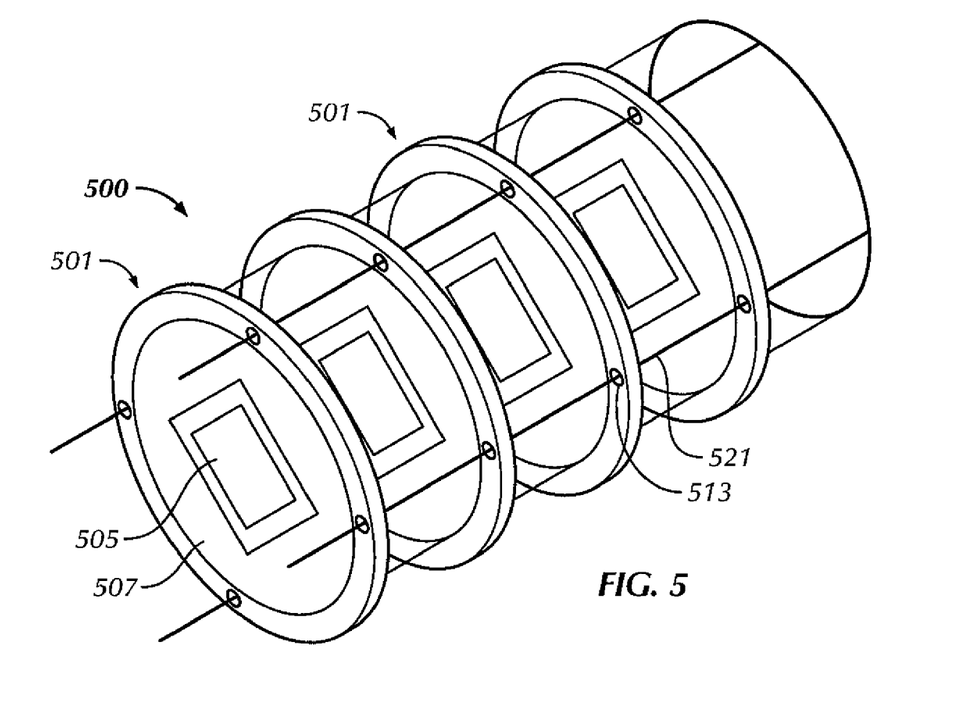
FIG. 5 is a perspective view of a light emitting apparatus in accordance with embodiments disclosed herein.
Figure 6A:
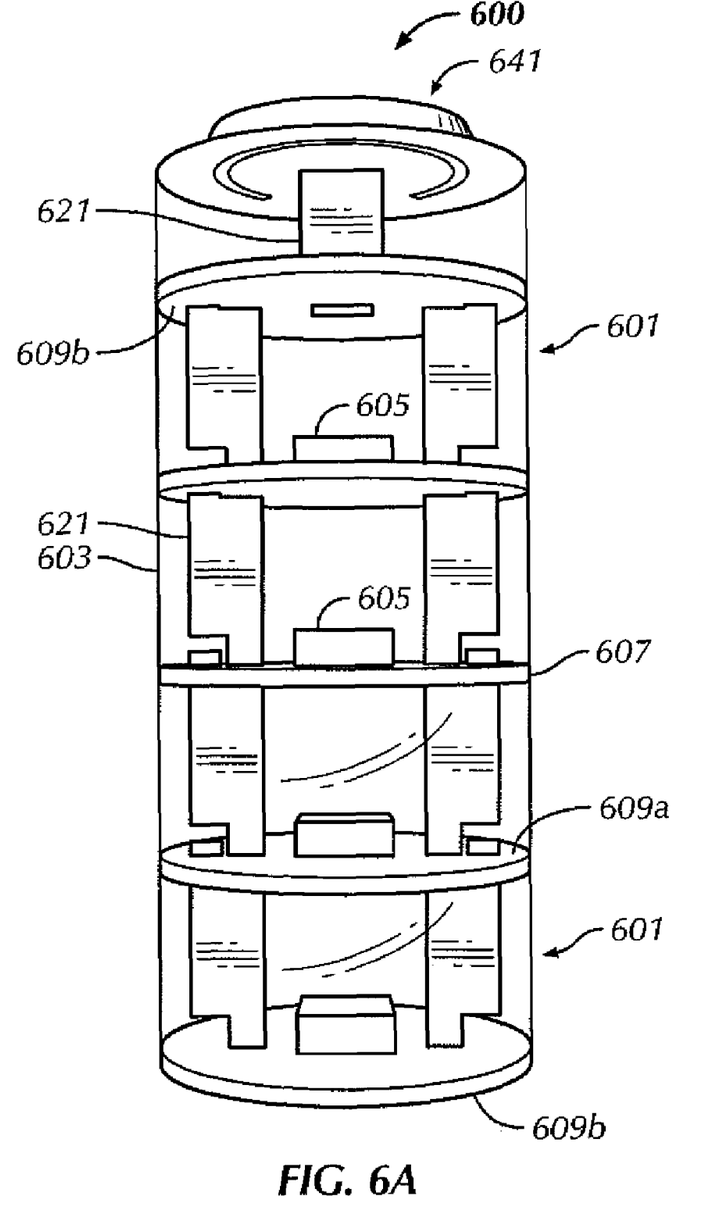
FIGS. 6A-D are perspective views of a light emitting apparatus in accordance with embodiments disclosed herein.
Figure 6B:
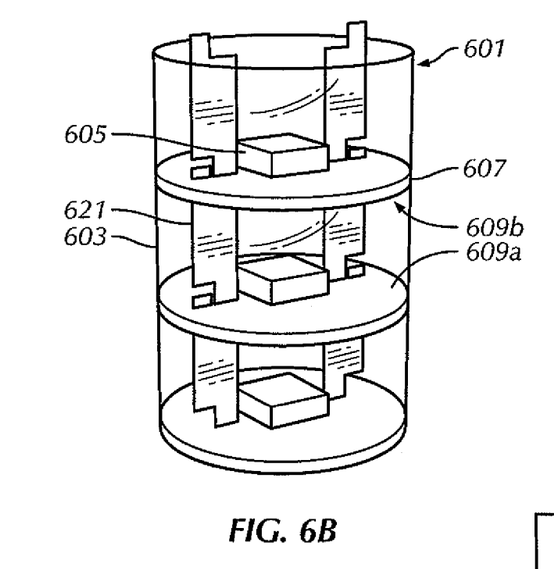
Figure 6C:
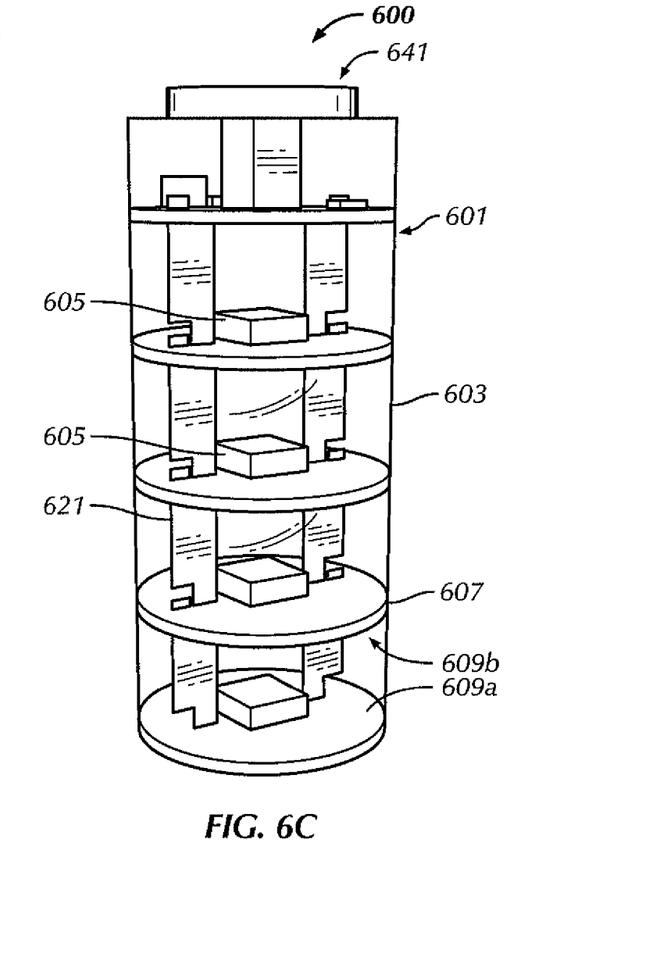
Figure 6D:
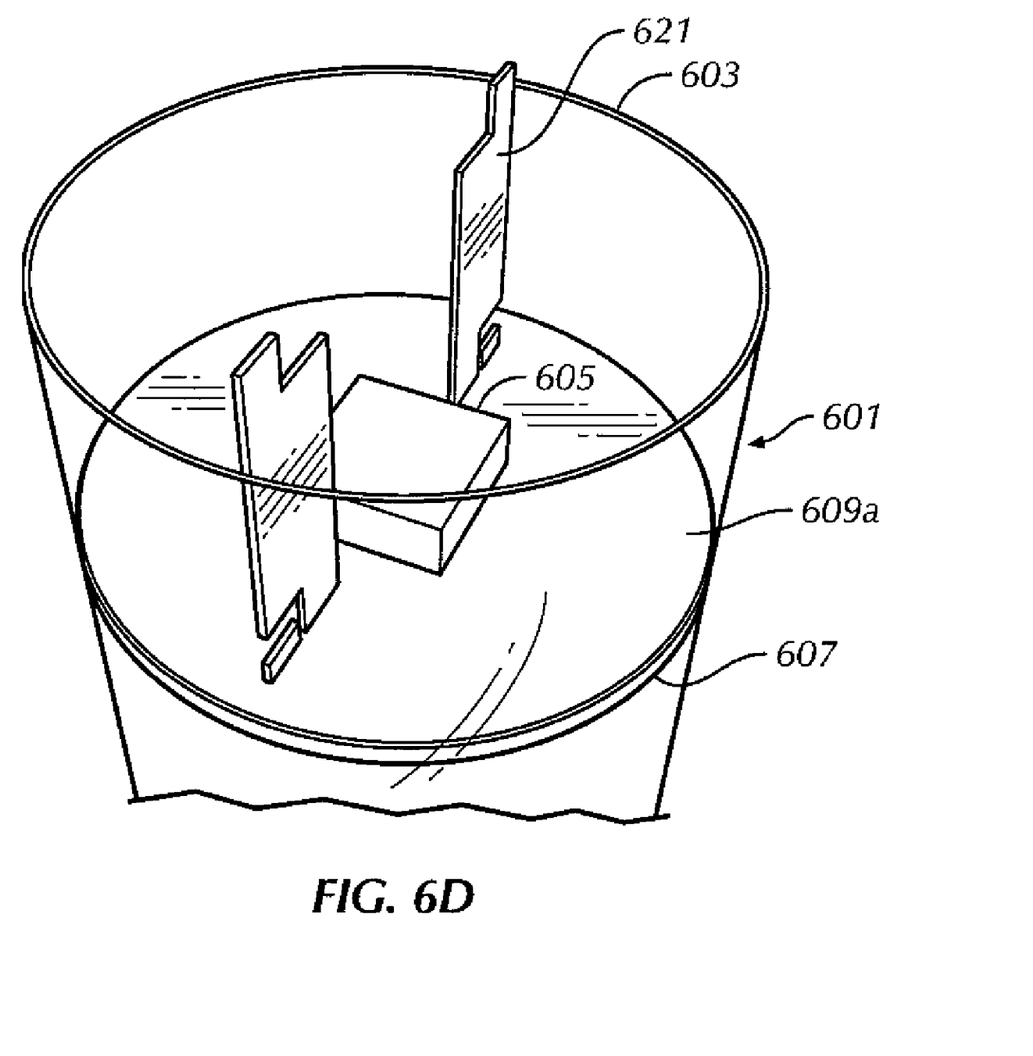

Referring now to FIG. 5, a perspective view of multiple modules 501 of a light emitting apparatus 500 in accordance with embodiments disclosed herein is shown. Similar to modules 301, 401 described above, modules 501 include light emitting elements 505 disposed on and electrically connected to PCBs 507. Further, in this embodiment, PCBs 507 include holes 513 for connectors 521 to pass through PCBs 507. As shown, connectors 521 disposed between PCBs 507 may include cables or wires. In such an embodiment, insulation of the cables or wires may be pierced at the location of the holes to provide an electrical connection with the PCBs. Alternatively, instead of piercing the cables or wires, the cables or wires may be cut and electrically connected to other locations of the PCBs. Alternatively still, the cables or wires may be clamped or secured by connectors disposed on the PCBs to provide an electrical connection with the PCBs.

Referring now to FIGS. 6A-D, perspective views of multiple modules 601 of a light emitting apparatus 600 in accordance with embodiments disclosed herein are shown. Light emitting elements 605 are disposed on planar surfaces 609 of PCBs 607 and electrically connected to PCBs 607 with an optical material 603 encompassing PCBs 607 and light emitting elements 605. Connectors 621 are disposed between and electrically connected to PCBs 607. Data and power signals to control light emitting elements 605 may be sent from a source (not shown) through an end 641 of light emitting apparatus 600 into each module 601 and PCB 607 using connectors 621. Thus, in this embodiment, the data and power signals for all the modules of the light emitting apparatus may be sent through the connectors into each module. As such, the modules may only use the data and power signals attributed to their particular module when controlled.

Alternatively, instead of only sending the data and power signals from one or more of the ends of the light emitting apparatus to the modules, those having ordinary skill in the art will appreciate that the modules of the light emitting apparatus may include electrical connections to receive power and data signals from one or more sources. For example, a module of the light emitting apparatus may include an electrical connection within the optical material and the PCB to allow for power and data signals from additional sources to be supplied to specific modules of the light emitting apparatus. As such, this may enable longer and/or larger light emitting apparatuses to be created because multiple electrical connections may be used to supply data and power signals to the light emitting apparatus.

Further, the modules of the light emitting apparatus may be manufactured separately such that each module may be independently connected and disconnected to the light emitting apparatus. In such an embodiment, the light emitting apparatus may be modular to enable quick and easy construction of the light emitting apparatus with the separately manufactured modules.

In the embodiments disclosed herein, the light emitting apparatus of the present invention includes multiple PCBs. These PCBs are arranged within the light emitting apparatus such that the planar surfaces of PCBs are 'substantially opposite' one another. As used herein, substantially opposite refers to the arrangement of the PCBs with respect to one another, in which the PCBs are arranged within the light emitting apparatus such that planar surfaces of the PCBs substantially face on another. Thus, when the planar surfaces of PCBs are substantially opposite, light emitting from a light emitting element disposed on one planar surface of a PCB may emit light onto another planar surface of a PCB. For example, in FIG. 6A, the planar surfaces 609A of PCBs 607 with light emitting elements 605 are directly opposite, parallel to, and facing planar surfaces 609B of PCBs 607 without light emitting elements 605. However, in another embodiment, when the planar surfaces of the PCBs are substantially opposite to one another, the orientation angles of the PCBs may be such that the planar surfaces of the PCBs are not parallel to one another. In such an embodiment, one planar surface of a PCB may be oriented 45 degrees in one direction, while a planar surface of the next PCB may be oriented 45 degrees in the other direction. Those having ordinary skill in the art will appreciate that other orientations and arrangements with PCBs substantially opposite of one another also exist and are included within the scope of the present invention.

Further, in the embodiments disclosed herein, the light emitting apparatus may include sensors disposed within the modules and electrically connected to the PCBs. The sensors may include image sensors (e.g., charge-coupled devices (CCD) or complementary metal-oxide-semiconductor (CMOS) sensors), infra-red sensors, sound sensors (e.g., microphone), in addition to any other sensors known in the art. The sensors may, for example, enable the light emitting apparatus to detect multiple working conditions of the apparatus and assist in determining if the light emitting apparatus is fully functional. Further, the sensors may enable the light emitting apparatus to detect multiple environmental conditions outside of the light emitting apparatus to determine, for example, if spectators are nearby or if other surrounding displays and apparatuses are in use. With detection of environmental conditions, the sensors may enable the light emitting apparatus to interact with its environment, such as illuminating in the presence of spectators.

With the inclusion of sensors within the light emitting apparatus, it may be beneficial to include a lens, prism, or any other optical device known in the art within the modules to assist in directing light within the modules. For example, if both a sensor and a light emitting element are included within a module, it is possible that neither the light emitting element nor the sensor is located within the center of the module. In such a embodiment, the light emitted from the light emitting element may illuminate one side of the module more than another side of the module. To prevent such a problem, an optical device may be included within the module of the light emitting apparatus to recreate a uniform distribution of light within the module.

Furthermore, in the embodiments disclosed herein, the light emitting apparatus may include photovoltaic components electrically connected to the PCBs. Generally, photovoltaic components convert energy from photons within light into electrical energy. With photovoltaic components, light (e.g., sunlight) may be converted into electrical energy to supplement at least a portion, if not all, of the power used by the light emitting apparatus.

Those having ordinary skill in the art will appreciate that although the modules of the present invention are shown such that each module may have two adjacent modules connected (generally an adjacent module connected above and an adjacent module connected below), the invention is not so limited. In other embodiments, a module may have more than two adjacent modules connected thereto. For example, a module of a light emitting element may have a general Y-shape to connect to three adjacent modules, or may have a general T-shape to connect to four adjacent modules. Thus, light emitting apparatuses of the present invention may have multiple branches originating from modules configured to connect to more than two adjacent modules.

Figure 7A:
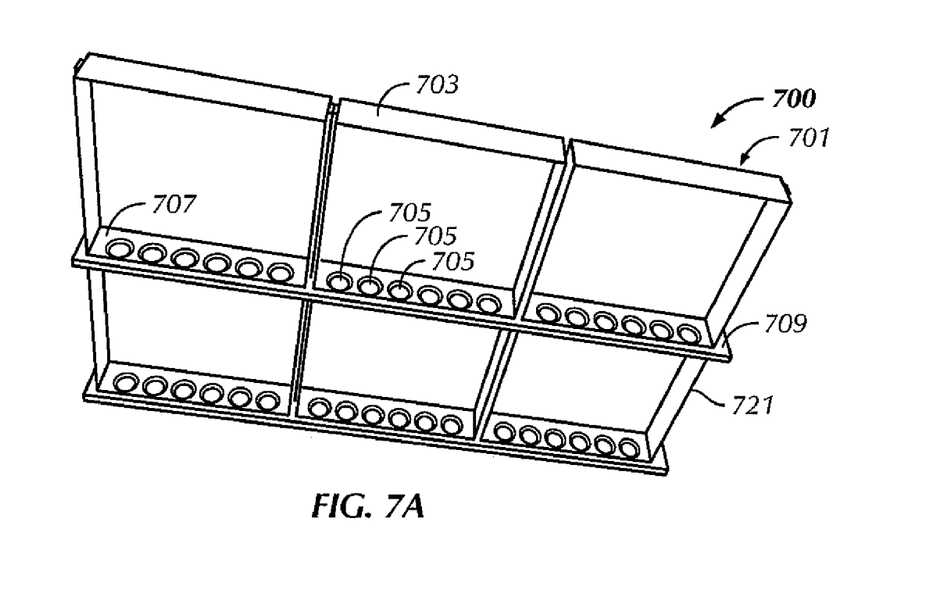
FIGS. 7A-B are perspective views of a light emitting apparatus in accordance with embodiments disclosed herein.
Figure 7B:
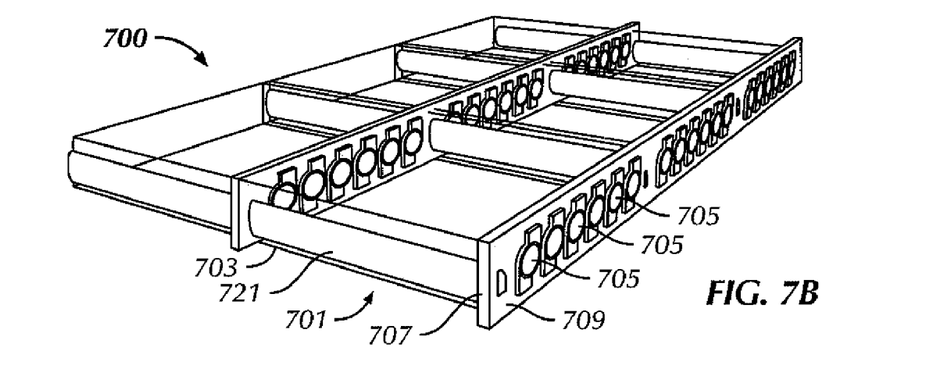

Additionally, as shown above, the PCBs and the light emitting apparatus of the present invention include a generally circular cross-section. However, those having ordinary skill in the art will appreciate that the invention is not so limited. In other embodiments, the cross-section of the PCBs and/or the light emitting apparatus may be square, triangular, oval, in addition to many other polygonal shapes known in the art. For example, in FIGS. 7A and 7B, a light emitting apparatus 700 in accordance with embodiments disclosed herein is shown. PCBs 707 of light emitting apparatus 700 are of a polygonal (e.g., rectangular) shape, with multiple light emitting elements 705 disposed upon and electrically connected to each PCB 707. An optical material 703 encompasses the multiple light emitting elements 705 and may allow light to emit through optical material 703.

Further, as shown above, the embodiments of the light emitting apparatus have power sent to the PCBs from an outside source. However, those having ordinary skill in the art will appreciate that the invention is not so limited. In other embodiments, an electrical energy storage device may be incorporated into the light emitting apparatus such that an outside power supply may not be needed. For example, a battery may be disposed on or within an end of the light emitting apparatus for power supply.

Embodiments of the present invention may provide for one or more of the following advantages. In one embodiment, the present invention may provide for a light emitting apparatus that is viewable from a 360 degree angle surrounding the light emitting apparatus. In another embodiment, multiple light emitting apparatuses may be used and stacked in a system, such as an array. This system may be a two or three-dimensional array, in which two or three-dimensional video images may be created with the array of light emitting apparatuses. In another embodiment, the present invention may provide for a flexible light emitting apparatus. In such an embodiment, the bendable apparatus may or may not spring back into its original form after being bent.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A light emitting apparatus, comprising:
   a plurality of printed circuit boards electrically connected to one another, each of the printed circuit boards comprising a planar surface;
   a light emitting element disposed on and electrically connected to each of the planar surfaces of the plurality of printed circuit boards;
   at least a first connector disposed on each planar surface of the plurality of printed circuit boards, and extending between the plurality of printed circuit boards,
   wherein each planar surface has an edge, and a shortest distance between the first connector to the edge is less than a shortest distance between the light emitting element to the edge; and
   an optical material substantially encompassing at least one of the plurality of printed circuit boards, wherein the plurality of printed circuit boards are disposed in a column alignment within the optical material.

2. The light emitting apparatus of claim 1, wherein the optical material comprises at least one of a transparent material, a translucent material, a diffusive material, a colored material, a refractive material, a reflective material, and a catadioptric material.

3. The light emitting apparatus of claim 1, wherein the optical material comprises at least one of a spherical shape, an aspherical shape, a convex shape, a concave shape, a conical shape, an elliptical shape, a hyperbolic shape, a parabolic shape, and a lenticular shape.

4. The light emitting apparatus of claim 1, wherein the plurality of printed circuit boards are electrically connected to one another by the at least a first connector.

5. The light emitting apparatus of claim 1, wherein the light emitting element comprises a plurality of light emitting elements, and wherein the plurality of light emitting elements are light emitting diodes emitting different colors.

6. The light emitting apparatus of claim 1, wherein the at least a first connector comprises at least one of a rigid material, a flexible material, and a spring material.

7. The light emitting apparatus of claim 1, wherein the at least a first connector comprises one of a pin, a blade, a cable, and a wire.

8. The light emitting apparatus of claim 1, wherein at least one of the plurality of printed circuit boards is disposed on a support structure.

9. The light emitting apparatus of claim 8, wherein the support structure comprises a first optical material.

10. The light emitting apparatus of claim 1, wherein at least one of the plurality of printed circuit boards comprises one of a circular shape and a polygonal shape.

11. The light emitting apparatus of claim 1, further comprising at least one sensor electrically connected to at least one of the plurality of printed circuit boards.

12. The light emitting apparatus of claim 11, wherein the sensor is one of an image sensor, an infra-red sensor, and a sound sensor.

13. The light emitting apparatus of claim 12, further comprising an optical device disposed within the light emitting apparatus.

14. The light emitting apparatus of claim 1, further comprising at least one photovoltaic component electrically connected to the light emitting apparatus.

15. The light emitting apparatus of claim 1, wherein at least one of the at least a first connector extends perpendicularly to a planar surface of a printed circuit board.

16. The light emitting apparatus of claim 1, wherein the optical material is a diffusive optical material that diffuses light emitted by light emitting elements of the plurality of printed circuit boards.

17. A light emitting apparatus, comprising:
a plurality of printed circuit boards electrically connected to one another, each of the printed circuit boards comprising a planar surface;
a light emitting element disposed on and electrically connected to each of the planar surfaces of the plurality of printed circuit boards; and
at least a first connector disposed on each planar surface of the plurality of printed circuit boards, and extending between the plurality of printed circuit boards,
wherein each planar surface has an edge, and a shortest distance between the first connector to the edge is less than a shortest distance between the light emitting element to the edge, and
wherein the planar surfaces of the plurality of printed circuit boards are substantially parallel and the first connector extends perpendicularly to the surfaces of the printed circuit boards.

18. The light emitting apparatus of claim 17, comprising:
a diffusive optical material, substantially encasing the plurality of printed circuit boards about their edges, wherein the diffusive optical material diffuses light emitted by light emitting elements of the printed circuit boards.

19. A light emitting apparatus, comprising:
a first printed circuit board comprising a first planar surface and a second planar surface;
a second printed circuit board comprising a first planar surface and a second planar surface, wherein the second planar surface of the second printed circuit board is arranged substantially opposite to the first planar surface of the first printed circuit board;
a first light emitting element disposed on the first planar surface of the first printed circuit board;
a second light emitting element disposed on the first planar surface of the second printed circuit board; and
at least one connector disposed on the first planar surface of the first printed circuit board and extending to the second planar surface of the second printed circuit board,
wherein the first planar surface of the first printed circuit board has a first edge, and a shortest distance between the at least one connector to the first edge is less than a shortest distance between the first light emitting element to the first edge.

20. The light emitting apparatus of claim 19, wherein the first printed circuit board is electrically connected to the second printed circuit board.

21. The light emitting apparatus of claim 19, wherein the planar surfaces of the first and second printed circuit boards are substantially parallel.

22. The light emitting apparatus of claim 19, further comprising an optical material substantially encompassing at least one of the plurality of printed circuit boards.

23. The light emitting apparatus of claim 19, wherein the at least one connector disposed on the first planar surface of the first printed circuit board and extending to the second planar surface of the second printed circuit board is a first connector, and the light emitting apparatus further comprises:
a second connector disposed on the first planar surface of the first printed circuit board, wherein a first distance between the first connector and the second connector is greater than a second distance between the first light emitting element and the first connector.

24. The light emitting apparatus of claim 19, wherein the at least one connector disposed on the first planar surface of the first printed circuit board extends perpendicularly to the first planar surface of the first printed circuit board.

25. The light emitting apparatus of claim 19, comprising:
a diffusive optical material, substantially encasing the first and second printed circuit boards about their edges, wherein the diffusive optical material diffuses light emitted by the first and second light emitting elements.

26. A method for manufacturing a light emitting apparatus, comprising:
providing a plurality of printed circuit boards, each having a first planar surface and a second planar surface;
disposing a light emitting element on the first planar surface of each of the plurality of printed circuit boards;
arranging a first printed circuit board of the plurality of printed circuit boards such that a first planar surface of the first printed circuit board faces a second planar surface of a second printed circuit board of the plurality of printed circuit boards; and
connecting the first and second printed circuit boards together using a connector disposed on the first planar surface of the first printed circuit board and extending to the second planar surface of the second printed circuit board, the first planar surface of the first printed circuit board has a first edge, and a shortest distance between the connector to the first edge is less than a shortest distance between a light emitting element of the first printed circuit board to the first edge.

27. The method for manufacturing a light emitting apparatus of claim 26, wherein each of the plurality of printed circuit boards is electrically connected to one another.

28. The method for manufacturing a light emitting apparatus of claim 26, further comprising:
arranging the plurality of printed circuit boards such that the first and second planar surfaces of each of the plurality of printed circuit boards are substantially parallel.

29. The method for manufacturing a light emitting apparatus of claim 26, further comprising:
encompassing at least one printed circuit board of the plurality of printed circuit boards with an optical material.

30. The method of claim 26, wherein the connector disposed on the first planar surface of the first printed circuit board extends perpendicularly to the first planar surface of the first printed circuit board.

31. The method of claim 26, comprising:
encasing the plurality of printed circuit boards about their edges with a diffusive optical material that diffuses light emitted by light emitting elements of the printed circuit boards.

* * * * *